United States Patent
Cardinali et al.

(10) Patent No.: US 10,411,329 B2
(45) Date of Patent: Sep. 10, 2019

(54) PACKAGED DEVICES WITH ANTENNAS

(71) Applicant: Apple Inc., Cupertino, CA (US)

(72) Inventors: Steven P. Cardinali, Campbell, CA (US); James G. Horiuchi, Fremont, CA (US)

(73) Assignee: Apple Inc., Cupertino, CA (US)

( * ) Notice: Subject to any disclaimer, the term of this patent is extended or adjusted under 35 U.S.C. 154(b) by 628 days.

(21) Appl. No.: 15/002,236

(22) Filed: Jan. 20, 2016

(65) Prior Publication Data

US 2017/0207524 A1  Jul. 20, 2017

(51) Int. Cl.
*H01Q 1/38* (2006.01)
*H01Q 1/24* (2006.01)
(Continued)

(52) U.S. Cl.
CPC .............. *H01Q 1/243* (2013.01); *H01Q 9/42* (2013.01); *H05K 3/284* (2013.01); *H01L 2223/6677* (2013.01); *H01L 2224/16227* (2013.01); *H01L 2924/15192* (2013.01); *H05K 1/186* (2013.01); *H05K 3/185* (2013.01); *H05K 2201/10098* (2013.01); *H05K 2203/1316* (2013.01); *H05K 2203/1322* (2013.01); *H05K 2203/1469* (2013.01)

(58) Field of Classification Search
CPC ............ H01Q 1/38; H01Q 1/24; H01Q 1/243; H01Q 9/42; H05K 3/243; H05K 3/185; H05K 2201/10098; H05K 2203/1316; H05K 2203/1322; H05K 2203/1469
See application file for complete search history.

(56) References Cited

U.S. PATENT DOCUMENTS

| 6,018,326 A | 4/2000 | Rudisill |
| 7,181,172 B2 | 2/2007 | Sullivan et al. |
(Continued)

FOREIGN PATENT DOCUMENTS

| CN | 1774804 A | 5/2006 |
| CN | 102324416 A | 1/2012 |
(Continued)

OTHER PUBLICATIONS

Perkins et al., U.S. Appl. No. 14/804,486, filed Jul. 21, 2015.

*Primary Examiner* — Dameon E Levi
*Assistant Examiner* — David E Lotter
(74) *Attorney, Agent, or Firm* — Treyz Law Group, P.C.; G. Victor Treyz; David K. Cole

(57) ABSTRACT

A packaged device may include electrical components such as integrated circuits that are mounted to a substrate such as a printed circuit substrate. Plastic may be molded to the printed circuit substrate over the integrated circuits. The molded plastic may include one or more shots of plastic and may include laser-sensitizable plastic material. Antenna structures may be supported by molded plastic such as molded plastic in a packaged device. The antenna structures may be formed from metal foil, flexible printed circuit substrate material with metal antenna traces, and metal traces that are formed on exposed surfaces of the plastic. The metal traces may be electroplated metal traces that are formed on regions of a laser-sensitizable plastic material that have been exposed to laser light. A package may have a protrusion that supports an antenna structure.

27 Claims, 16 Drawing Sheets

(51) Int. Cl.
*H05K 3/28* (2006.01)
*H01Q 9/42* (2006.01)
H05K 1/18 (2006.01)
H05K 3/18 (2006.01)

(56) References Cited

U.S. PATENT DOCUMENTS

| | | | |
|---|---|---|---|
| 7,804,450 | B2 | 9/2010 | Sullivan et al. |
| 8,482,469 | B2 | 7/2013 | Ayala et al. |
| 2006/0250298 | A1 | 11/2006 | Nakazawa et al. |
| 2009/0020328 | A1* | 1/2009 | Sullivan ............... H01Q 1/2283 174/268 |
| 2013/0076574 | A1* | 3/2013 | Rappoport ............. H01Q 1/243 343/702 |
| 2014/0100004 | A1* | 4/2014 | Yarga .................... H01Q 1/243 455/575.8 |
| 2014/0153211 | A1* | 6/2014 | Malek .................... H01Q 1/243 361/809 |
| 2014/0166350 | A1* | 6/2014 | Rappoport ............. H01Q 1/38 174/258 |
| 2014/0210078 | A1 | 7/2014 | Buehler |
| 2015/0216053 | A1* | 7/2015 | Sauer .................... H05K 1/141 361/783 |
| 2015/0313003 | A1 | 10/2015 | Kasar |

FOREIGN PATENT DOCUMENTS

| | | | |
|---|---|---|---|
| CN | 102437405 | A | 5/2012 |
| CN | 102646862 | A | 8/2012 |
| CN | 103427150 | A | 12/2013 |
| CN | 104254917 | A | 12/2014 |

\* cited by examiner

PACKAGED DEVICES WITH ANTENNAS

FIELD

This relates generally to electronic devices and, more particularly, to system-in-package devices.

BACKGROUND

Electronic devices often include integrated circuits and other components that are mounted within semiconductor packages. System-in-package devices contain multiple integrated circuits mounted together in a single package. Use of this type of packaged device may be desirable in applications where space is at a premium.

In compact devices, it can be challenging to mount components efficiently. Signal routing paths and mounting structures can consume more space than desired and package layouts are often not sufficiently efficient to accommodate complex housing geometries. It can be difficult to incorporate antennas into a compact device without interfering with other electrical components.

SUMMARY

A packaged device may include electrical components such as integrated circuits that are mounted to a substrate such as a printed circuit substrate. The electrical components may include bare semiconductor die or packaged components such as packaged integrated circuits. Plastic may be molded to the printed circuit substrate over the integrated circuits to form a packaged device such as a system-in-package device.

The molded plastic of the packaged device may include one or more shots of plastic and may include laser-sensitizable plastic material. Antenna structures may be formed on molded plastic such as molded plastic in a packaged device. The antenna structures may be formed from metal foil, flexible printed circuit substrate material with metal antenna traces, and metal traces that are formed on exposed surfaces of the plastic material. The metal traces may be electroplated metal traces that are formed on regions of a laser-sensitizable plastic material that have been exposed to laser light.

A package may have a protruding plastic portion that supports an antenna structure such as an inverted-F antenna resonating element for an inverted-F antenna. The antenna structure on a package protrusion may be received within a groove in a display cover layer. The display cover layer may overlap display layers for a display. The display layers may display images in an active area of the display. The groove may run along the periphery of the package in an inactive area of the display.

DETAILED DESCRIPTION

Electronic devices may be provided with integrated circuits and other electrical components. These components may be mounted on a substrate such as a printed circuit board and embedded within molded plastic that forms an electrical component package. In configurations in which the circuitry of all or part of an electrical device or other system is mounted on the substrate, a packaged device with electrical components of this type may sometimes be referred to as a system-in-package device. To incorporate system-in-package devices and other packaged devices within a compact electronic device, one or more antennas may be formed from conductive antenna structures that are supported by the molded plastic of the packaged devices.

Figure 1:
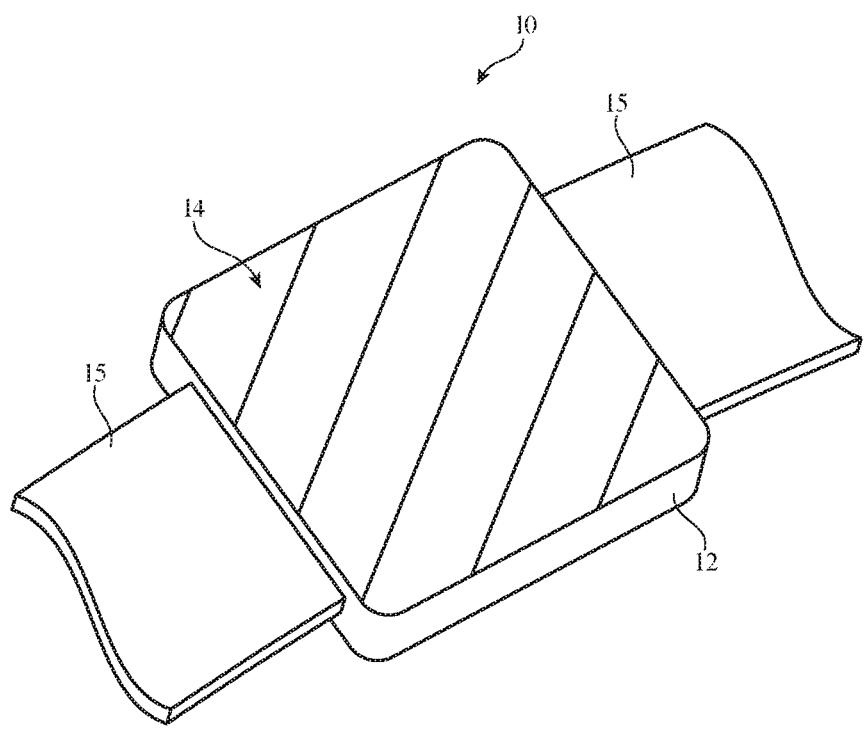
FIG. 1 is a perspective view of an illustrative electronic device of the type that may be provided with electrical component package structures in accordance with an embodiment.

FIG. 1 is a perspective view of an illustrative electronic device of the type that may include an antenna or other conductive component that is supported by plastic in a packaged device such as a system-in-package device.

Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, an accessory (e.g., earbuds, a remote control, a wireless trackpad, etc.), or other electronic equipment. In the illustrative configuration of FIG. 1, device 10 is a portable device such as a wristwatch. Other configurations may be used for device 10 if desired. The example of FIG. 1 is merely illustrative.

As shown in FIG. 1, device 10 may include display 14. Display may be mounted in housing 12. In the illustrative configuration of FIG. 1, display 14 has a rectangular outline and housing 12 has a correspondingly rectangular footprint. Other shapes may be used for display 14 and housing 12 if desired.

Housing 12, which may sometimes be referred to as an enclosure or case, may be formed from plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Openings may be formed in housing 12 to form communications ports, holes for buttons, and other structures.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch sensor electrodes may be formed from an array of indium tin oxide pads or other transparent conductive structures.

Display 14 may have an active area that includes an array of pixels. The array of pixels may be formed from liquid crystal display (LCD) components, an array of electrophoretic pixels, an array of plasma display pixels, an array of organic light-emitting diode pixels or other light-emitting diode pixels, an array of electrowetting pixels, or pixels based on other display technologies.

Display 14 may be protected using a display cover layer such as a layer of transparent glass, clear plastic, transparent ceramic, sapphire or other transparent crystalline material, or other transparent layer(s). The display cover layer may have a planar shape, a convex curved profile, a concave curved profile, a shape with planar and curved portions, a layout that includes a planar main area surrounded on one or more edges with a portion that is bent out of the plane of the planar main area, or other suitable shape. Openings may be formed in the display cover layer to accommodate buttons, speaker ports, and other components.

If desired, a strap such as wrist strap 15 may be attached to housing 12. Strap 15 may be used to attach device 10 to the wrist of a user. Strap 15 may be formed from metal, plastic, leather, or other materials. If desired, strap 15 may be omitted (e.g., in configurations in which device 10 is too large to comfortably wear on a user's wrist).

Figure 2:
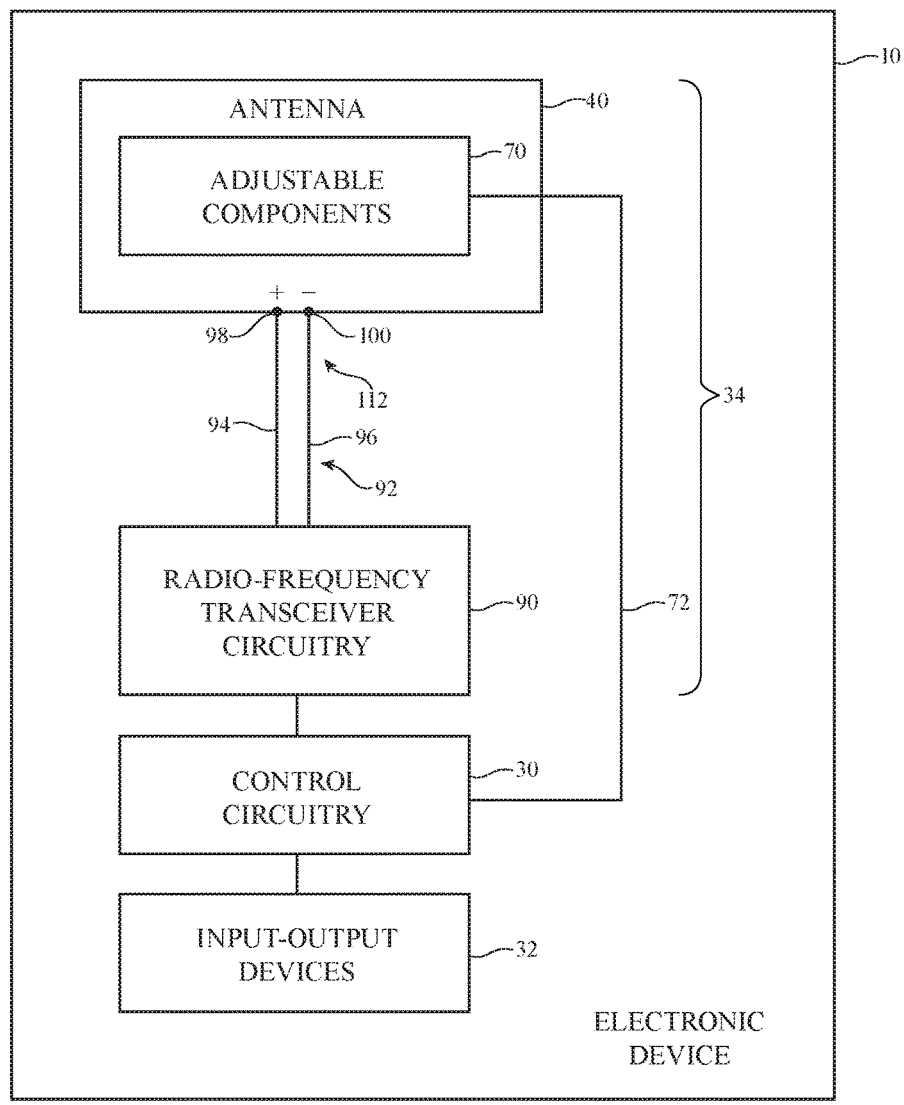
FIG. 2 is a schematic diagram of an illustrative electronic device with wireless circuitry in accordance with an embodiment.

A schematic diagram showing illustrative components that may be used in device 10 is shown in FIG. 2. As shown in FIG. 2, device 10 may include storage and processing circuitry such as control circuitry 30. Circuitry 30 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in circuitry 30 may be used to control the operation of device 10. This processing circuitry may be based on one or more microprocessors, microcontrollers, digital signal processors, baseband processor integrated circuits, application specific integrated circuits, etc.

Circuitry 30 may be used to run software on device 10, such as internet browsing applications, voice-over-internet-protocol (VOIP) telephone call applications, email applications, media playback applications, operating system functions, etc. To support interactions with external equipment, circuitry 30 may be used in implementing communications protocols. Communications protocols that may be implemented using circuitry 30 include wireless local area network protocols (e.g., IEEE 802.11 protocols—sometimes referred to as WiFi®), protocols for other short-range wireless communications links such as the Bluetooth® protocol, cellular telephone protocols, near-field communications protocols, and other wireless communications protocols.

Device 10 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices may include touch screens, displays without touch sensor capabilities, buttons, joysticks, scrolling wheels, touch pads, key pads, keyboards, microphones, cameras, speakers, status indicators, light sources, audio jacks and other audio port components, digital data port devices, light sensors, accelerometers, proximity sensors, and other sensors and input-output components.

Device 10 may include wireless communications circuitry 34 that allows control circuitry 30 of device 10 to communicate wirelessly with external equipment. The external equipment with which device 10 communicates wirelessly may be a computer (e.g., a laptop computer, a desktop computer, a tablet computer, etc.), a cellular telephone, a watch, a router or other wireless local area network equipment, a wireless base station in a cellular telephone network, a display, or other electronic equipment. Wireless communications circuitry 34 may include radio-frequency (RF) transceiver circuitry 90 and one or more antennas such as antenna 40. Configurations in which device 10 contains a single antenna may sometimes be described herein as an example.

Radio-frequency transceiver circuitry 90 and antenna(s) 40 may be used to handle one or more radio-frequency communications bands. For example, circuitry 90 may include wireless local area network transceiver circuitry that may handle a 2.4 GHz band for WiFi® and/or Bluetooth® communications and, if desired, may include 5 GHz transceiver circuitry (e.g., for WiFi®). If desired, circuitry 90 and antenna(s) 40 may handle communications in other bands (e.g., cellular telephone bands between 700 MHz and 2700 MHz and other suitable frequencies), near field communications bands at 13.75 MHz and other near-field communications frequencies, bands at millimeter wave frequencies (e.g., extremely high frequency communications bands at 25 GHz, 60 GHz, etc.).

Antenna(s) 40 in wireless communications circuitry 34 may be formed using any suitable types of antenna. For example, an antenna for device 10 may include a resonating element that is formed from a loop antenna structure, a patch antenna structure, an inverted-F antenna structure, a slot antenna structure, a planar inverted-F antenna structure, a helical antenna structure, a hybrid of these structures, etc. If desired, device 10 may include cavity-backed antennas. Circuitry 30, input-output devices 32, wireless circuitry 34, and other components of device 10 may be mounted in device housing 12.

As shown in FIG. 2, transceiver circuitry 90 in wireless circuitry 34 may be coupled to antennas such as antenna 40 using paths such as transmission line path 92. Transmission line paths in device 10 such as transmission line 92 may include coaxial cable paths, microstrip transmission lines, stripline transmission lines, edge-coupled microstrip transmission lines, edge-coupled stripline transmission lines, transmission lines formed from combinations of transmission lines of these types, etc. Transmission line 92 may be coupled to antenna feed 112. Antenna 40 of FIG. 2 may, for example, form an inverted-F antenna, a planar inverted-F antenna, a slot antenna, a hybrid inverted-F slot antenna, a monopole, a dipole, a patch antenna, or other antenna having an antenna feed such as feed 112 with a positive antenna feed terminal such as terminal 98 and a ground antenna feed terminal such as ground antenna feed terminal 100. Positive transmission line conductor 94 may be coupled to positive antenna feed terminal 98 and ground transmission line conductor 96 may be coupled to ground antenna feed terminal 100. Other types of antenna feed arrangements may be used and multiple antennas 40 may be provided in device 10, if desired. The illustrative feeding configuration of FIG. 2 is merely illustrative.

Filter circuitry, switching circuitry, impedance matching circuitry, and other circuitry may be interposed within transmission line 92 or other portions of wireless circuitry 34, if desired. Control circuitry 30 may be coupled to transceiver circuitry 90 and input-output devices 32. During operation, input-output devices 32 may supply output from device 10 and may receive input from sources that are external to device 10. Control circuitry 30 may use wireless circuitry 34 to transmit and receive wireless signals. Control circuitry 30 may control adjustable components 70 over control paths such as path 72. Adjustable components 70 may be coupled to conductive structures associated with antenna 40 and may be used in tuning antenna 40. Adjustable components 70 may include tunable inductors, tunable capacitors, and other adjustable circuitry. Adjustable components 70 may include discrete components that are coupled to adjustable circuits such as switches. With this type of arrangement a switch may be used to switch a desired component into use in antenna 40, thereby tuning antenna 40. If desired, adjustable components 70 may also include continuously adjustable circuitry (e.g., continuously adjustable inductors, capacitors, etc.).

Figure 3:
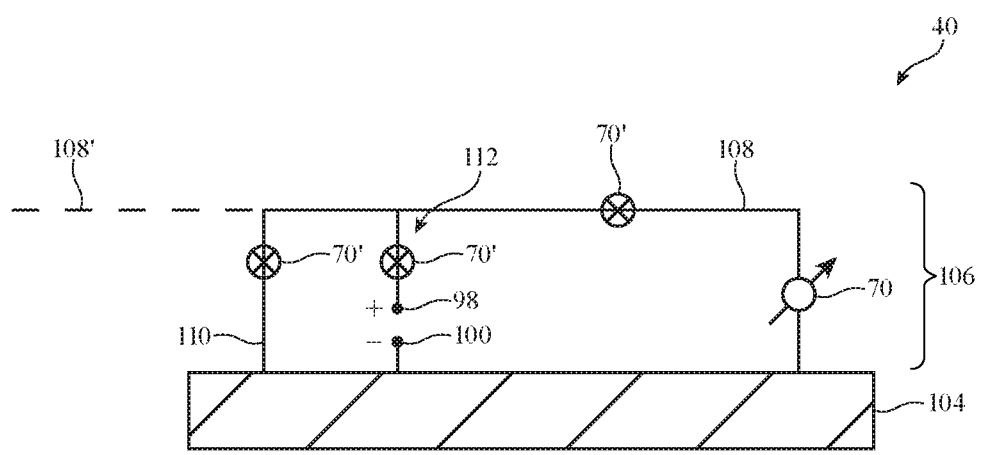
FIG. 3 is a schematic diagram of an illustrative antenna in accordance with an embodiment.

FIG. 3 is a schematic diagram of an illustrative antenna for device 10. In the example of FIG. 3, antenna 40 is an inverted-F antenna having inverted-F antenna resonating element 106 and antenna ground 104. Resonating element 106 may have a main resonating element arm such as arm 108. If desired, element 106 may have multiple branches (e.g., a first branch formed from arm 108, a second arm formed from branch 108', etc.). The lengths of each of the branches of element 106 may be selected to support communications band resonances at desired frequencies (e.g., a high band resonance may be supported using a shorter branch and a low band resonance may be supported using a longer branch). Antenna resonances may also be produced from resonating element harmonics and/or from using parasitic antenna resonating elements.

As shown in FIG. 3, antenna resonating element 106 (e.g., arm 108) may be coupled to ground by return path 110. Antenna feed 112 may be coupled between antenna resonating element arm 108 and ground 104 in parallel with return path 110. Antenna feed 112 may be formed from antenna feed terminals 98 and 100. Antenna feed terminal 100 may be coupled to antenna ground 104. Ground 104 may be formed from metal portions of housing 12 (e.g., portions of housing 12B), metal traces on a printed circuit or other carrier (e.g., a main logic board in device 10, a printed circuit in a packaged device, etc.), internal metal bracket members, sheet metal members, and other conductive structures in device 10.

In the illustrative configuration of FIG. 3, adjustable component 70 has been coupled between the tip of antenna resonating element arm 108 and ground 104. If desired, adjustable components for antenna 40 may be located at other portions of antenna resonating element 106 (see, e.g., illustrative adjustable components 70'). Adjustable components may also be incorporated into impedance matching circuits, filter circuits, and other circuitry associated with the operation of antenna 40.

Figure 4:
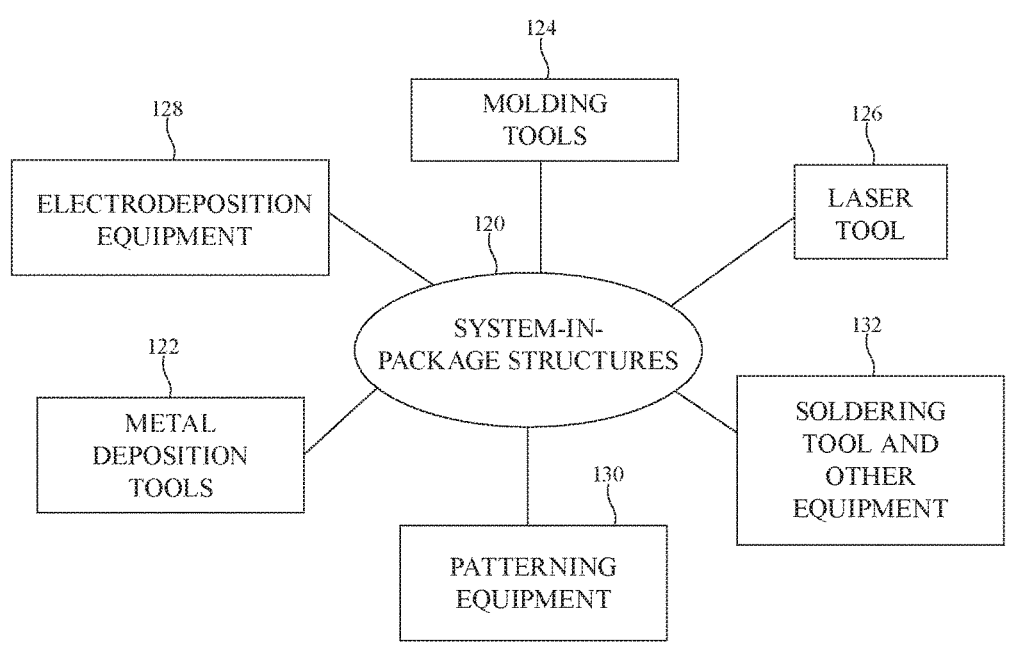
FIG. 4 is a diagram showing illustrative equipment of the type that may be used in forming system-in-package structures in accordance with an embodiment.

A diagram of a system with illustrative equipment for forming antennas on electrical component package structures such as system-in-package structures 120 or other packaged devices is shown in FIG. 4. Metal deposition tools 122 may include equipment for depositing metal layers. Tools 122 may include physical vapor deposition equipment, chemical vapor deposition equipment, atomic layer deposition equipment, equipment for printing conductive inks and other conductive materials (e.g., ink-jet printing equipment, pad printing equipment, screen printing equipment), and other deposition equipment. Tools 122 may be used to deposit layers of metal on dielectric structures (e.g., plastic) and other structures in system-in-package structures 120.

Molding tools 124 may include equipment for molding thermoplastic polymers (e.g., plastic for forming the body of an electrical component package or other structures 120) and other polymers. Molding tools 124 may have heated dies for molding plastic into desired shapes under heat and pressure. Plastic may be injection molded, may be compression molded, or may be molded using other molding techniques. Metal structures (e.g., metal posts, sheet metal members, and other metal structures) may be insert molded into plastic using tools 124. Insert-molded metal structures may be completely embedded within plastic or may have exposed conductive portions (e.g., exposed conductive surfaces, exposed protruding portions, etc.).

Laser tool 126 may include a laser for applying laser light to selective portions of a plastic substrate or other portions of structures 120. The laser may emit light at any suitable wavelength (ultraviolet, visible, and/or infrared). Laser light may be continuous wave laser light and/or pulsed laser light and may be focused to increase the intensity of the laser light where the laser light is illuminating structures 120. Laser tool 126 may be used to selectively activate structures such as laser-sensitizable plastic structures in system-in-package structures 120. Laser-sensitizable plastic suitable for laser activation may be filled with additives that render the plastic sensitive to laser light exposure. Following selective application of laser light to the plastic in this way, the plastic may be electroplated using electrodeposition equipment 128. During plating operations, metal will selectively electroplate onto the areas of structures 120 that were selectively illuminated using laser light from tool 126. Laser tool 126 may also be used for laser drilling of holes in metal and plastic structures, laser welding, soldering, etc.

Patterning equipment 130 may include photolithographic patterning equipment (e.g., equipment for patterning metal layers and other layers by photomasking and etching techniques and/or other processing techniques).

Soldering tool and other equipment 132 may also be used in processing system-in-package structures 120. Equipment 132 may be used in soldering metal structures together (e.g., equipment 132 may include equipment such as a hot bar soldering tool, a reflow oven, a laser soldering tool, or other soldering equipment), equipment 132 may include machining equipment, equipment for welding metal structures together, equipment for joining conductive structures using crimping or conductive adhesive, computer-controlled equipment for assembling structures to form structures 120 and to form finished electronic devices, and other equipment.

Using equipment of the type shown in FIG. 4, electrical component packages may be formed that include antennas. As an example, components may be mounted on a printed circuit. The components may then be overmolded using one or more shots of plastic. Metal structures may be incorporated into the packaged electrical components to form metal components such as one or more antennas.

Figure 5:
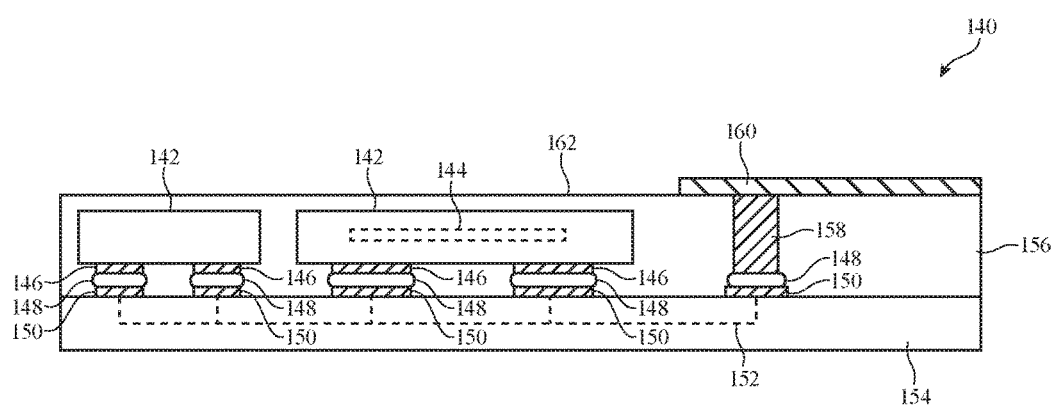
FIG. 5 is a cross-sectional side view of an illustrative electrical component package with an antenna in accordance with an embodiment.

An illustrative packaged device is shown in FIG. 5. Packaged device 140 of FIG. 5, which may sometimes be referred to as a system-in-package, system-in-package device, or electrical component package, may include one or more electrical components such as components 142. Components 142 may include integrated circuits (e.g., transceiver circuitry 90, control circuitry 30, etc.), may include discrete components (e.g., capacitors, inductors, resistors), may include switches, and may include other circuitry. There may, in general, be any suitable number of components 142 in device 140 (e.g., one or more, two or more, five or more, ten or more, 2-20, fewer than 40, more than twenty, or other suitable number of components).

Plastic (e.g., a thermoplastic material) such as plastic 156 may be molded over components 142 and substrate 154. There may be one or more shots of plastic (i.e., separately molded portions of plastic) in packaged device 140. The example of FIG. 5 in which a single shot of plastic is molded over components 142 is merely illustrative.

Substrate 154 may be a flexible printed circuit (e.g. a printed circuit formed from a sheet of polyimide or other flexible polymer layer) or may be a rigid printed circuit (e.g., a printed circuit formed from a rigid printed circuit board material such as fiberglass-filled epoxy). If desired, substrate 154 may be formed from a ceramic or other dielectric substrate material. Substrate 154 may include patterned metal traces 152 for forming electrical signal paths and contact pads such as contacts 150.

Components 142 may be packaged integrated circuits or other packaged electrical components that each include a semiconductor die (see, e.g., silicon integrated circuit die 144 in the example of FIG. 5). In this type of arrangement, each die 144 is bonded to a substrate and embedded within a plastic package body to form a respective component 142. If desired, components 142 may include one or more bare semiconductor dies. Configurations in which components 142 are packaged components are sometimes described herein as an example.

Components 142 may have solder pads or other contacts such as contacts 146 (e.g., contacts associated with substrates within the packages of components 142). Components 142 may be mounted to contacts 150 on substrate 154 using conductive material 148. Conductive material 148 may be, for example solder that is coupled between component contacts 146 and substrate contacts 150 of device 10.

Substrate 154 may have one or more layers of interconnects formed from patterned metal traces 152 (e.g., signal lines, vias, contacts 150, etc.). Solder or other conductive material 148 may be used to couple conductive structures such as metal member 158 to contacts 150. Metal member 158 may be, for example, a metal post for carrying signals through plastic 156.

As shown in the illustrative configuration of FIG. 5, metal member 158 may have one end that is coupled to one of contacts 150 and an opposing end that is exposed at surface 162 of plastic 156. Metal traces 160 or other conductive structures may be coupled to the exposed portion of metal member 158 on surface 162. Metal traces 160 may be patterned to form an antenna such as antenna 40 of FIG. 2 or may be patterned to form other metal structures (e.g., a strain gauge, a temperature sensor, or other sensor or electrical component). Illustrative arrangements in which traces 160 are used in forming antennas may sometimes be described herein as an example.

Figure 6:
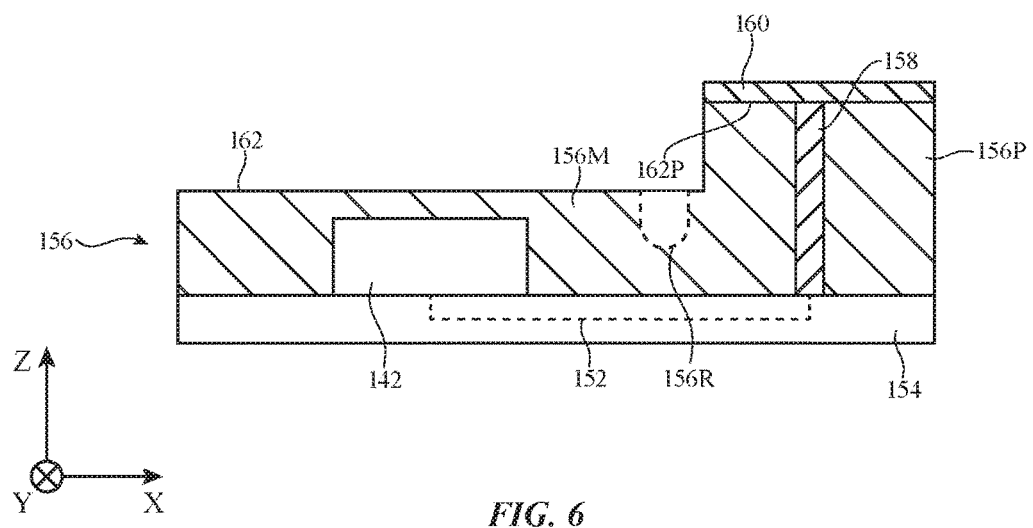
FIG. 6 is a cross-sectional side view of an illustrative electrical component package with an antenna on a package protrusion in accordance with embodiment.

Plastic 156 may be formed in a single shot (e.g., a single injection molding operation using a single type of plastic material) or may be formed using two or more successive shots of plastic material of one or more types. As shown in FIG. 6, plastic 156 may have protruding portions. For example, plastic 156 may have a main portion 156M that is characterized by planar upper surface 162 and that is molded over one or more components 142 in a planar shape (i.e., a shape that lies in the X-Y plane of FIG. 6 and that is characterized by a rectangular footprint or other suitable outline shape) and may have a protruding portion 156P that protrudes outwardly from main portion 156M (i.e., upwardly in direction Z in the example of FIG. 6). Antenna traces 160 may be formed on elevated surface 162P of protrusion 156P and may form an antenna resonating element. This may help to vertically separate antenna traces 160 from antenna ground traces formed from traces 152 in substrate 154, to separate antenna traces 160 from an antenna ground formed from metal portions of housing 12, or to help separate antenna traces 160 from other ground structures within device 10.

There may be one or more protrusions such as protrusion 156P in plastic 156 and the protrusions of plastic 156 may extend in any desired direction (vertically up, vertically down, horizontally, diagonally, etc.). Protrusions may have flat exterior surfaces, curved surfaces, and/or textured surfaces. Configurations in which plastic 156 has recessed portions (see, e.g., illustrative recess 156R of FIG. 6) may also be used. Metal antenna traces 160 may, if desired, overlap recesses, protrusions, and/or other portions of the surface of plastic 156. Some or all of the metal structures for antenna 40 may also be formed from metal that is embedded fully or partly within plastic 156.

In the examples of FIGS. 5 and 6, metal member 158 has the shape of a vertically extending metal post. This is merely illustrative. Embedded conductive structures such as members 158 of FIGS. 5 and 6 may, in general, be formed from curved metal structure, from flexible printed circuit structures, from brackets, posts, or other metal members, from stamped sheet metal parts, or from other conductive structures.

Figure 7:
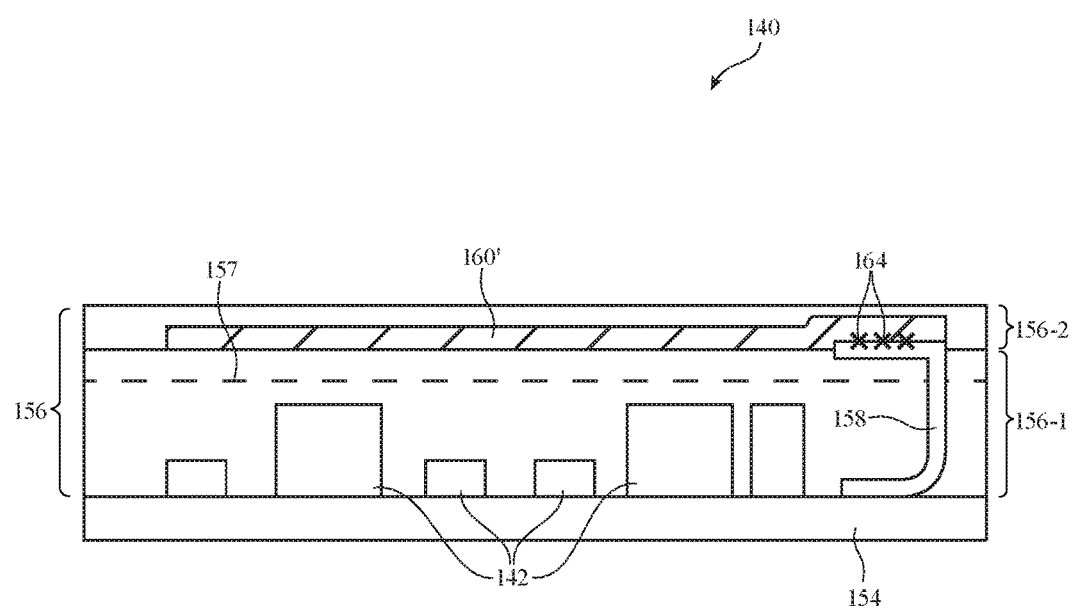
FIG. 7 is a cross-sectional side view of an illustrative electrical component package with an antenna formed within multiple shots of plastic in accordance with an embodiment.

FIG. 7 is a cross-sectional side view of packaged device 140 in an illustrative configuration in which plastic 156 includes two shots of plastic material: first plastic shot 156-1 and second plastic shot 156-2. Plastic shot 156-1 may be molded over components 142 and a first (lower) portion of metal structure 158. Metal structure 158 may be a sheet metal member or other metal member that is soldered or otherwise coupled to a contact on substrate 154. A portion of metal structure 158 may protrude out of plastic shot 156-1 and may be coupled to metal antenna structure 160' using conductive connections 164 (e.g., solder joints, welds, conductive adhesive, etc.). Metal antenna structure 160' may be formed from a stamped sheet metal layer (i.e., patterned metal foil), may be formed from patterned metal traces on a flexible printed circuit or other substrate, or may be metal traces deposited using physical vapor deposition, printing, or other deposition techniques.

Following formation of metal antenna structure 160', second plastic shot 156-2 may be formed. Plastic shot 156-2 may cover some or all of metal antenna structure 160'. In the example of FIG. 7, plastic shot 156-2 covers all of metal antenna structure 160' so that metal antenna structure 160' is embedded within plastic 156. If desired, plastic 156 of FIG. 7 may have protrusions, recesses, and other non-planar features, as described in connection with FIG. 6. Antenna structure 160 may lie on the boundary between first shot 156-1 and 156-2 (i.e., on the upper surface of shot 156-1) or the boundary between first shot 156-1 and 156-2 may lie below antenna structure 160 so that antenna structure 160, as shown by illustrative boundary 157 of FIG. 7. If desired, one or more metal shielding layers may be included in packaged devices. For example, device 140 of FIG. 7 may include a metal shielding layer formed along boundary 157.

In general, any suitable technique may be used in forming antenna structures for antenna 40 such as machining, cutting, stamping, printing, photolithography, etc. With one suitable arrangement, laser patterning may be used in forming antenna structures for antenna 40. Laser patterning processes may use thermoplastic materials that can be locally sensitized by exposure to laser light. These materials may sometimes be referred to as laser-sensitizable plastic. Once sensitized, electroplating may be used to deposit additional metal and thereby form a desired pattern of conductive antenna traces. When forming packaged device 140, one or more shots of plastic 156 may be formed from laser-sensitizable plastic.

Figure 8:
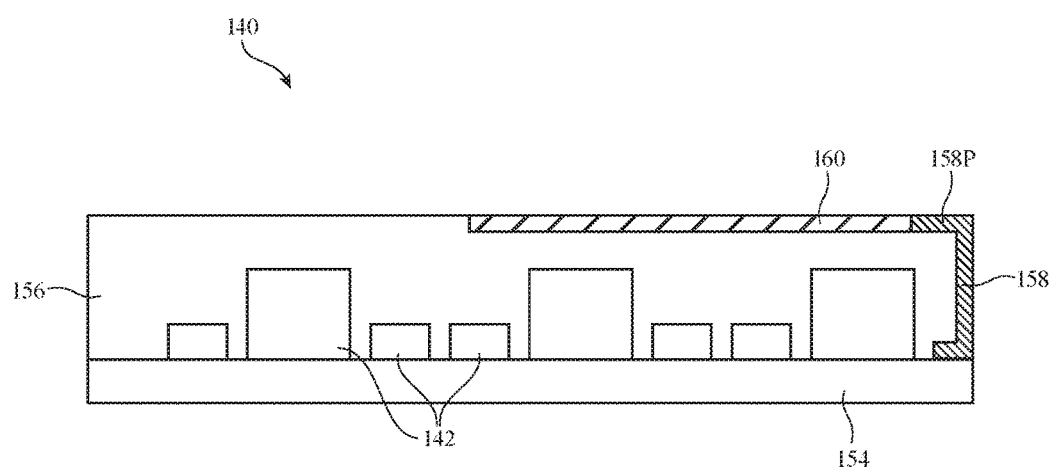
FIG. 8 is a cross-sectional side view of an illustrative electrical component package with an antenna formed from plated metal on a laser-activated region of a plastic package body in accordance with an embodiment.

FIG. 8 is a cross-sectional side view of packaged device 140 in an illustrative configuration in which plastic 156 has been formed using laser-sensitizable material. Laser-sensitizable plastic 156 may be molded over components 142 on substrate 154. Metal member 158 (e.g., a metal post or other signal path structure) may be mounted to a contact on substrate 154 and may be molded within plastic 156 so that portion 158P of member 158 is accessible on the surface of plastic 156. Plastic 156 may be selectively exposed to laser light (e.g., in the desired shape of an antenna resonating element or other antenna structure). Following electroplating operations, metal antenna trace 160 may contact and be electrically shorted to metal member portion 158P.

Figure 9:
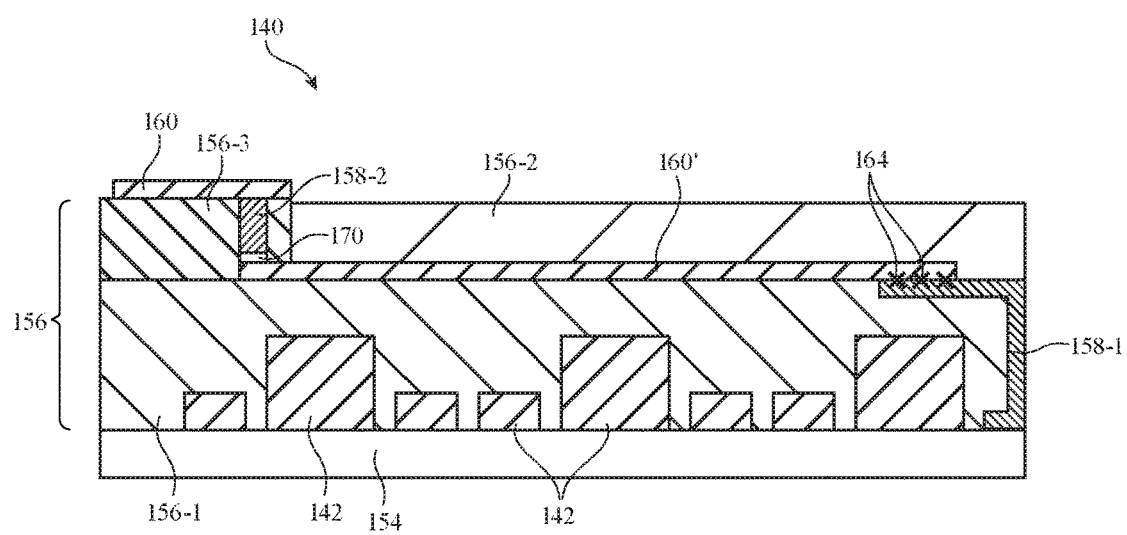
FIG. 9 is a cross-sectional side view of an illustrative electrical component package that has an antenna and that is formed from multiple shots of plastic in accordance with an embodiment.

Another illustrative configuration for packaged device 140 is shown in FIG. 9. In the example of FIG. 9, plastic 156 includes three shots of plastic: first plastic shot 156-1, second plastic shot 156-2, and third plastic shot 156-3. First plastic shot 156-1 may be used to cover components 142 and substrate 154. Metal structure 158-1 may be a metal post, a spring, or other metal member that serves as a signal path through plastic 156-1. Metal structure 158-1 may be soldered or otherwise connected to a contact on substrate 154 and may be partly or fully embedded in plastic 156-1.

Metal antenna structure 160' may be coupled to a portion of metal structure 158-1. Metal antenna structure 160' may be a sheet metal member (e.g., stamped metal foil), may be a flexible printed circuit with patterned antenna traces, or may be a metal structure that is deposited and patterned on layer 156-1 using other techniques. Metal antenna structure 160' may be coupled to structure 158-1 using conductive connections 164 (e.g., solder, welds, conductive adhesive, etc.).

Second plastic shot 156-2 may be used to cover metal antenna structure 160' and thereby help hold structure 160' within packaged device 140. Metal structure 158-2 (e.g., a metal post or other metal member) may be coupled to metal antenna structure 160' (e.g., using solder 170, welds, conductive adhesive, etc.). Plastic shots 156-1 and 156-2 may be insensitive to laser light or may be formed form laser-sensitizable plastic.

Third plastic shot 156-3 may be formed over some or all of structure 158-2. Structure 158-2 may be a metal post or other structure that is used to route signals through third plastic shot 156-3. Metal structure 158-2 may have an exposed portion to which metal antenna traces 160 may be connected. Third plastic shot 156-3 may be formed from laser-sensitizable plastic and metal antenna trace 160 may be formed by electroplating metal onto the surface of plastic 156-3 after activating selected regions of plastic 156-3 by exposing these regions of plastic 156-3 to laser light. If desired, portions of plastic 156 (e.g., the portion under antenna trace 160 and/or under antenna structure 160' may include protrusions and/or recesses. Antenna 40 (e.g., an inverted-F antenna resonating element or other antenna structure) may be formed from antenna structure 160' and/or antenna structure 160.

Figure 10:
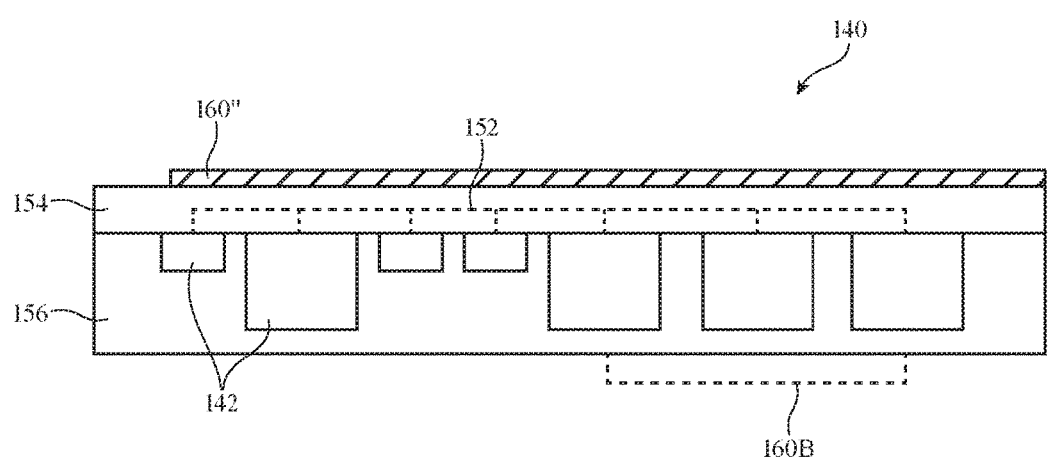
FIG. 10 is a cross-sectional side view of an illustrative electrical component package that includes antenna traces formed on one side of a printed circuit substrate and electrical components formed on an opposing side of the printed circuit substrate in accordance with an embodiment.

In the example of FIG. 10, packaged device 140 has components 142 that are mounted on the lower surface of substrate 154 and has an antenna structure that is formed from patterned metal traces 160" on the opposing upper surface of substrate 154. Plastic 156 may be molded over components 142 and, if desired, may be molded over some or all of antenna traces 160" on the upper surface of substrate 154. If desired, antenna traces for antenna 40 may be formed from portions of metal traces 152 embedded within substrate 154 and/or may be formed on plastic 156 in addition to substrate 154 (see, e.g., metal trace 160B).

Figure 11:
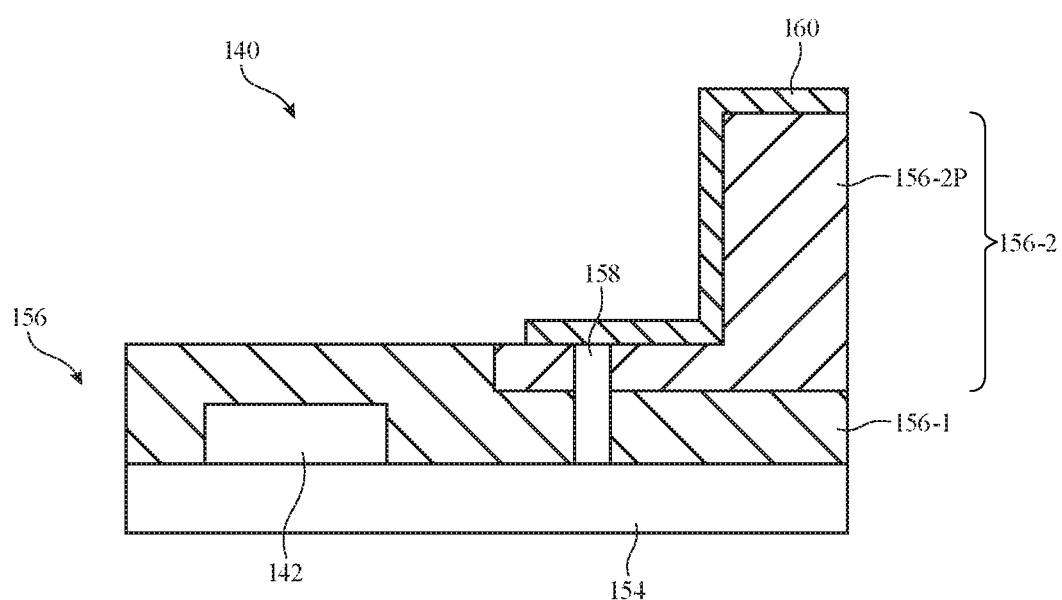
FIG. 11 is a cross-sectional side view of an illustrative packaged device with a protrusion on which an antenna trace is formed in accordance with an embodiment.

In the example of FIG. 11, first plastic shot 156-1 of plastic 156 covers component(s) 142 on substrate 154. Metal structure 158 protrudes through shot 156-1. Second plastic shot 156-2 of plastic 156 covers remaining portions of metal structure 158, but leaves a surface portion of metal structure 158 exposed so that metal antenna trace 160 can contact structure 158. Second plastic shot 156-2 may be formed from laser-sensitizable plastic and may have a protruding portion such as protruding portion 156-2P. Antenna trace 160 may be formed by electroplating metal onto the activated portions of plastic 156-2 so that trace 160 is coupled to structure 158.

Figure 12:
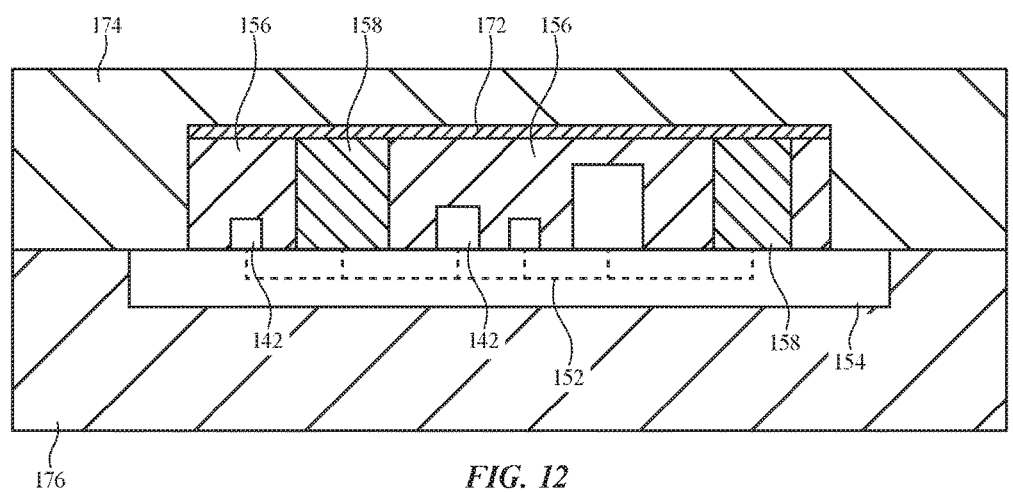
FIGS. 12 and 13 are cross-sectional side view of illustrative electrical component package structures during fabrication in accordance with an embodiment.
Figure 13:
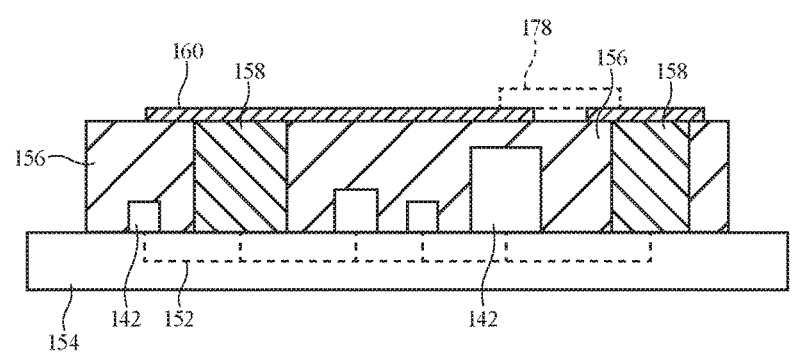

FIGS. 12 and 13 are cross-sectional side views of packaged device 140 during and after fabrication using a film-assist molding technique. In the illustrative configuration of FIG. 12, device 140 is being formed by molding plastic 156 over components 142 and metal structures 158. A soft polymer film such as flexible film 172 may be used to cover the surfaces of metal structures 158 and thereby ensure that plastic 156 does not adhere to these surfaces. While plastic film 172 is in place within a plastic mold formed from die structure such as upper mold die 174 and lower mold die 176, plastic 156 may be injection molded into the mold cavity formed between dies 174 and 176, thereby covering components 142 and substrate 154 and surrounding metal structures 158. Plastic 156 may be formed from laser-sensitizable plastic.

After removal of device 140 from the mold, selected regions of plastic 156 may be exposed to laser light and electroplating operations may be performed so that metal traces 160 are formed on the surface of plastic 156 and metal structures 158, as shown in FIG. 13. If desired, electrical components such as component 178 (e.g., adjustable components 70 of FIG. 2) or other circuitry may be soldered or otherwise coupled to exterior portions of device 140 of FIG. 13 and/or other packaged devices 140. Additional plastic may be molded over component 178 to protect component 178.

Figure 14:
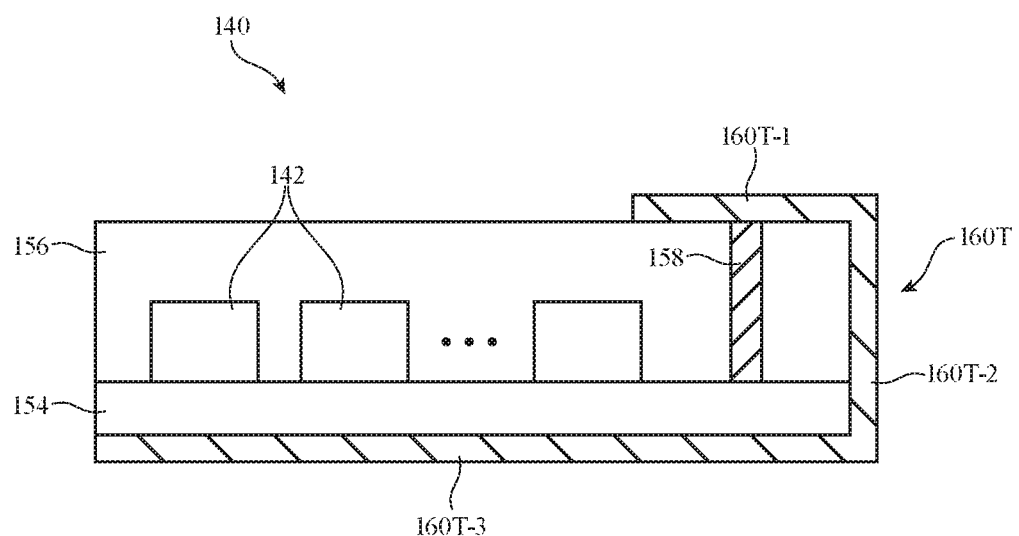
FIG. 14 is a cross-sectional side view of an illustrative electrical component package having front and rear antenna structures in accordance with an embodiment.

As shown in the illustrative configuration of FIG. 14, antenna traces 160T may be formed on one or more sides of packaged device 140. For example, antenna traces 160T may include upper surface traces 160T-1 and side traces 160T-2 formed using laser activation of laser-sensitizable plastic followed by electroplating and may include lower surface traces 160T-3. Traces 160T-3 may be metal traces such as traces 152 on the lower surface of substrate 154 and/or metal traces 152 that are embedded within substrate 154. With this type of arrangement, an antenna resonating element may be formed from traces 160T-1 and an antenna ground may be formed from traces 160T-3 (as an example).

Figure 15:
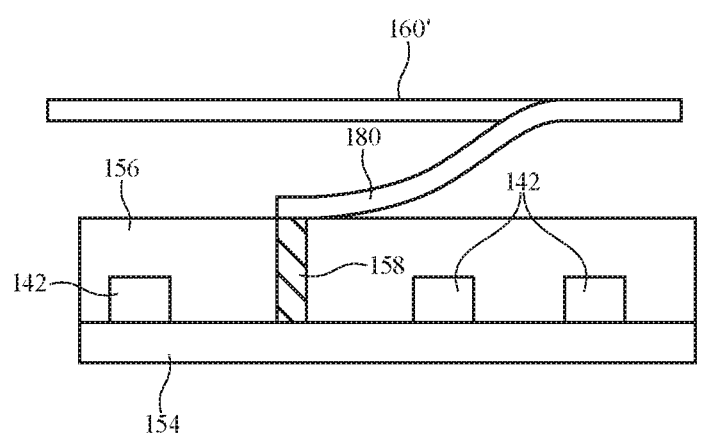
FIG. 15 is a cross-sectional side view of an illustrative packaged electrical component in contact with a metal structure that forms an antenna in accordance with an embodiment.

FIG. 15 shows how antenna structure 160' may have a portion such as portion 180 that serves as a spring. Portion 180 may impart force in the downwards direction (in the orientation of FIG. 15) so that antenna structure 160' is electrically connected to member 158.

Figure 16:
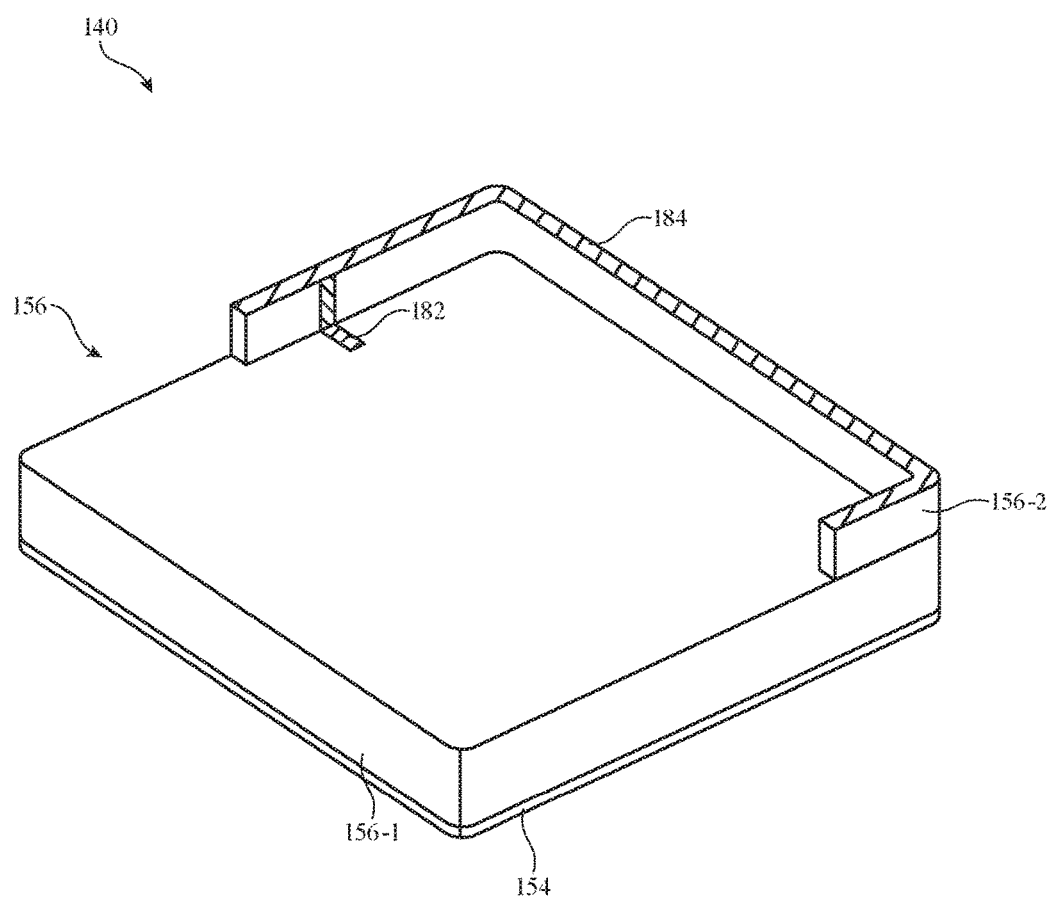
FIG. 16 is a perspective view of an illustrative electrical component package with an antenna resonating element formed along a protrusion that runs along the periphery of the component package in accordance with an embodiment.

If desired, antenna 40 may be formed from antenna traces that run along the periphery of packaged device 140 as shown in FIG. 16. In the example of FIG. 16, components 142 have been mounted on substrate 154 and covered with plastic 156. Plastic 156 may contain one or more shots of plastic. As an example, plastic 156 may contain a first shot of plastic such as shot 156-1 that has a planar shape and covers components 142 and substrate 154 and may have a second shot of plastic such as shot 156-2 that protrudes upwardly from shot 156-1 around some or all of the periphery of shot 156-1. Shot 156-1 may be formed from a plastic that is insensitive to laser exposure and shot 156-2 may be formed from laser-sensitizable plastic material (as an example). If desired, plastic 156 may be formed from a single shot that forms protrusions.

Antenna 40 may be formed from metal structure that are supported by protruding peripheral portions 156-2. For example, antenna 40 may contain metal 184 and metal 182. Metal 182 may be coupled to traces 152 in substrate 154 using metal member 158 in plastic 156. Metal 182 and/or metal 184 may be formed from an electroplated layer of metal traces formed in laser activated regions of shot 156-2 or may be formed from stamped metal foil, machined metal, a flexible printed circuit containing metal traces, or other metal antenna structures.

Figure 17:
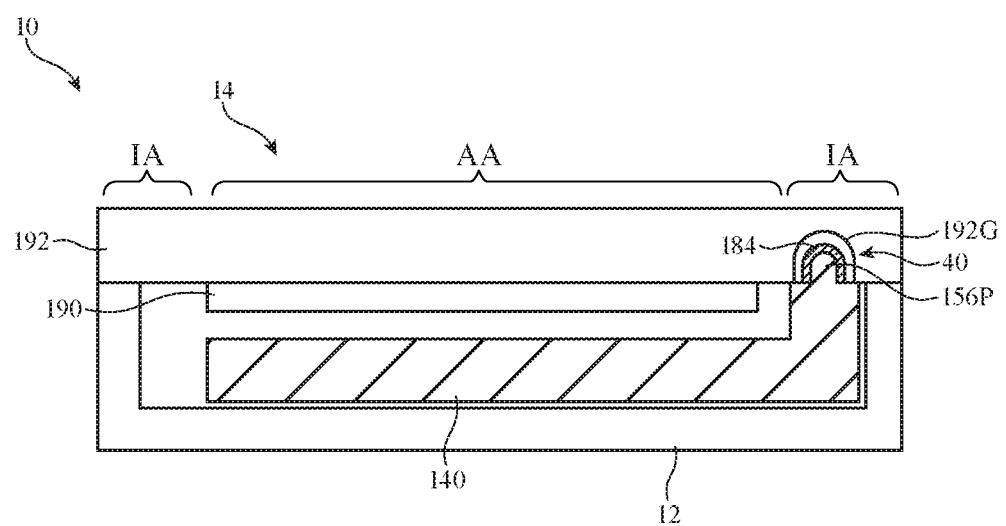
FIG. 17 is a cross-sectional side view of an illustrative electrical component package with a protrusion that supports an antenna trace that is received within a peripheral groove in a display cover layer in accordance with an embodiment.

A cross-sectional side view of device 10 in an illustrative configuration in which an antenna has been formed on a packaged device such as device 140 of FIG. 16 is shown in FIG. 17. As shown in FIG. 17, device 10 may include a display such as display 14. Display 14 may have an active area AA in which display layers 190 are used to display images for a user. Display layers 190 may include an array of pixels that form a liquid crystal display, an organic light-emitting diode display, or other suitable display. Display 14 may also have border regions such as inactive areas IA that are free of pixels and that do not display images. Display 14 may have a cover layer such as cover layer 192 that is formed from a transparent material such as glass, plastic, ceramic, sapphire or other crystalline materials, and/or other transparent layers. Display cover layer 192 may overlap and protect display layers 190.

Antenna 40 may be formed from metal antenna structures 184 on packaged device 140. Metal antenna structures 184 may form an antenna resonating element (e.g., an inverted-F antenna resonating element, a patch antenna resonating element, a loop antenna resonating element, a monopole antenna resonating element, a dipole antenna resonating element, a slot antenna resonating element, or other suitable antenna resonating element), a parasitic antenna resonating element, antenna ground structures, or other portions of antenna 40. In the example of FIG. 17, metal antenna structures 184 form part of antenna resonating element 106 of FIG. 3 (e.g., an inverted-F antenna resonating element). Housing 12 (e.g., a metal housing) and ground traces 152 in substrate 154 may form antenna ground 104 of FIG. 3.

As shown in FIG. 17, display cover layer 192 may have recess such as groove 192G that runs along some or all of the periphery of layer 192 and device 10. Antenna structure 184 may be received within groove 192G. Packaged device 140 may have a protrusion such as plastic protrusion 156P that supports antenna structure 184. Protrusion 156P may be formed from laser-sensitizable plastic such as plastic 156-2 of FIG. 16 and structure 184 may be formed from metal traces on activated portions of protrusion 156P that have been exposed to laser light and/or structure 184 may be formed from metal foil, traces in a flexible printed circuit, or other conductive structures.

The foregoing is merely illustrative and various modifications can be made by those skilled in the art without departing from the scope and spirit of the described embodiments. The foregoing embodiments may be implemented individually or in any combination.

What is claimed is:

1. A packaged device, comprising:
   a printed circuit substrate with metal traces;
   an electrical component with contacts coupled to portions of the metal traces;
   a first shot of molded plastic on the printed circuit that contacts and covers the electrical component;
   a second shot of molded plastic on the first shot of molded plastic, wherein the first shot of molded plastic is interposed between the second shot of molded plastic and the printed circuit substrate; and
   a metal antenna trace on the second shot of plastic.

2. The packaged device defined in claim 1 wherein the second shot of molded plastic comprises laser-sensitizable plastic and wherein the metal antenna trace comprises electroplated metal on an activated portion of the laser-sensitizable plastic that has been exposed to laser light.

3. The packaged device defined in claim 2 wherein the second shot of plastic forms a protrusion on the first shot of plastic and wherein the electroplated metal is formed on the protrusion.

4. The packaged device defined in claim 1 wherein the electrical component comprises one of a plurality of electrical components that are coupled to portions of the metal traces.

5. The packaged device defined in claim 4 wherein the first shot of molded plastic contacts and covers each of the plurality of electrical components.

6. The packaged device defined in claim 5 wherein each of the plurality of electrical components comprises a semiconductor die and a plastic package in which the semiconductor die is packaged.

7. The packaged device defined in claim 1 further comprising a third shot of molded plastic.

8. The packaged device defined in claim 7 wherein the third shot of molded plastic comprises laser-sensitizable plastic and wherein the metal antenna trace comprises electroplated metal on an activated portion of the laser-sensitizable plastic that has been exposed to laser light.

9. The packaged device defined in claim 1 wherein at least one of the metal traces on the printed circuit substrate comprises an antenna resonating element.

10. The packaged device defined in claim 1 wherein the metal antenna trace is configured to form an inverted-F antenna resonating element.

11. The packaged device defined in claim 10 wherein the packaged device has a periphery and wherein the inverted-F antenna resonating element runs along at least part of the periphery.

12. The packaged device defined in claim 1 wherein the metal antenna trace is configured to form a patch antenna resonating element.

13. The packaged device defined in claim 1 wherein the metal antenna trace is configured to form a loop antenna resonating element.

14. A system-in-package device, comprising:
a printed circuit substrate with metal traces;
integrated circuits with contacts coupled to portions of the metal traces;
a first shot of molded plastic on the printed circuit that covers the integrated circuits;
a second shot of molded plastic on the first shot of molded plastic;
a third shot of molded plastic;
a first antenna structure on the third shot of plastic;
a second antenna structure that is electrically coupled to the first antenna structure;
a first metal post that is coupled between a contact formed from one of the metal traces on the printed circuit substrate and the second antenna structure through the first shot of molded plastic; and
a second metal post that is coupled between the second antenna structure and the first antenna structure on the third shot of molded plastic.

15. The system-in-package device defined in claim 14 wherein the third shot of plastic is formed from a laser-sensitizable plastic and wherein the first antenna structure comprises an electroplated metal trace on a laser activated region of the third shot of plastic.

16. The system-in-package device defined in claim 15 wherein the second antenna structure is a sheet metal antenna structure that is electrically coupled to the electroplated metal trace.

17. An electronic device, comprising:
a housing;
a packaged device in the housing;
a display coupled to the housing; and
a metal antenna structure on the packaged device, wherein the metal antenna structure comprises a metal antenna trace that forms at least part of an antenna resonating element for an antenna, wherein the display has a transparent cover layer with a recess, and wherein the metal antenna trace is at least partly received within the recess.

18. The electronic device defined in claim 17 wherein the packaged device has a printed circuit substrate and integrated circuits soldered to the printed circuit substrate, wherein the packaged device has thermoplastic material molded over the integrated circuits, and wherein the metal antenna trace is formed on a surface of the thermoplastic material.

19. The electronic device defined in claim 17 wherein the transparent cover layer has a periphery and wherein the recess comprises a groove that runs along at least part of the periphery.

20. A packaged device, comprising:
a single printed circuit substrate having opposing first and second surfaces, wherein the first surface faces a first direction and the second surface faces a second direction that is opposite the first direction;
a plurality of integrated circuits soldered to contacts on the first surface of the printed circuit substrate;
plastic molded over the integrated circuits; and
a metal antenna trace on the second surface of the printed circuit substrate.

21. A packaged device, comprising:
a printed circuit substrate with metal lines;
an electrical component with contacts coupled to portions of the metal lines;
a shot of molded plastic on the printed circuit that covers the electrical component, wherein the electrical component is embedded in the shot of molded plastic;
a metal trace on the shot of plastic; and
a metal post that extends through the shot of molded plastic and couples the metal lines of the printed circuit substrate to the metal trace.

22. The packaged device defined in claim 21 wherein the shot of plastic forms a protrusion and wherein the metal trace comprises electroplated metal on the protrusion.

23. The packaged device defined in claim 22 wherein the shot of molded plastic comprises laser-sensitizable plastic and wherein the electroplated metal comprises electroplated metal on an activated portion of the laser-sensitizable plastic that has been exposed to laser light.

24. The packaged device defined in claim 23 wherein the electrical component comprises one of a plurality of electrical components that are coupled to portions of the metal lines.

25. The packaged device defined in claim 24 wherein the shot of molded plastic covers each of the plurality of electrical components.

26. The packaged device defined in claim 25 wherein each of the plurality of electrical components comprises a semiconductor die and a plastic package in which the semiconductor die is packaged.

27. The packaged device defined in claim 26, wherein the metal trace comprise a metal antenna trace, wherein the packaged device has a periphery, and wherein the metal antenna trace runs along at least part of the periphery.

* * * * *